United States Patent
Namiki et al.

(10) Patent No.: US 8,916,894 B2
(45) Date of Patent: Dec. 23, 2014

(54) LIGHT-REFLECTIVE ANISOTROPIC CONDUCTIVE ADHESIVE AGENT, AND LIGHT EMITTING DEVICE

(75) Inventors: Hidetsugu Namiki, Tochigi (JP); Shiyuki Kanisawa, Tochigi (JP); Hideaki Umakoshi, Tochigi (JP); Akira Ishigami, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 13/640,784

(22) PCT Filed: Apr. 13, 2011

(86) PCT No.: PCT/JP2011/059194
§ 371 (c)(1),
(2), (4) Date: Nov. 14, 2012

(87) PCT Pub. No.: WO2011/129373
PCT Pub. Date: Oct. 20, 2011

(65) Prior Publication Data
US 2013/0049054 A1    Feb. 28, 2013

(30) Foreign Application Priority Data
Apr. 13, 2010 (JP) ................. 2010-092672

(51) Int. Cl.
| | |
|---|---|
| H01L 23/48 | (2006.01) |
| C09J 11/04 | (2006.01) |
| C09J 9/02 | (2006.01) |
| H01L 33/60 | (2010.01) |
| H01L 23/00 | (2006.01) |
| H01L 33/62 | (2010.01) |
| C08K 3/22 | (2006.01) |
| C08K 9/06 | (2006.01) |
| H01L 33/40 | (2010.01) |

(52) U.S. Cl.
CPC ................. *H01L 24/32* (2013.01); *H01L 24/48* (2013.01); *H01L 33/62* (2013.01);
(Continued)

(58) Field of Classification Search
CPC ........................ H01L 2924/0103; H01L 24/06
USPC ............ 257/98–100, E33.072, 753; 252/500, 252/519
See application file for complete search history.

(56) References Cited

U.S. PATENT DOCUMENTS 6,096,411 A * 8/2000 Nakatani et al. .............. 428/209
2006/0014085 A1 1/2006 Nakajima et al.

FOREIGN PATENT DOCUMENTS

| JP | 8-059890 A | 3/1996 |
|---|---|---|
| JP | 11-168235 A | 6/1999 |

(Continued)

OTHER PUBLICATIONS

International Search Report w/translation from PCT/JP2011/059194 mailed on Jun. 28, 2011 (4 pages).
(Continued)

*Primary Examiner* — Tran Tran
(74) *Attorney, Agent, or Firm* — Osha Liang LLP

(57) ABSTRACT

A light-reflective anisotropic conductive adhesive and light-emitting device capable of maintaining luminous efficiency of a light-emitting element and preventing the occurrence of a crack to obtain conduction reliability are provided. The light-reflective anisotropic conductive adhesive contains a thermosetting resin composite, conductive particles, and a light-reflective acicular insulating particles. These light-reflective acicular insulating particles are inorganic particles of at least one type selected from the group including titanium oxide, zinc oxide, and titanate.

18 Claims, 3 Drawing Sheets

(52) U.S. Cl.
CPC ............. *H01L 2924/01029* (2013.01); *H01L 2924/01082* (2013.01); *H01L 2224/49107* (2013.01); *H01L 2224/13339* (2013.01); *H01L 2224/45144* (2013.01); *H01L 2924/01006* (2013.01); *H01L 2924/01033* (2013.01); *H01L 2224/29339* (2013.01); *H01L 2924/12041* (2013.01); *H01L 2224/16225* (2013.01); *H01L 2924/01046* (2013.01); *C09J 11/04* (2013.01); *H01L 2924/0665* (2013.01); *H01L 2224/92247* (2013.01); *H01L 2924/07811* (2013.01); *H01L 2924/01057* (2013.01); *C08K 2003/2296* (2013.01); *H01L 2224/48227* (2013.01); *H01L 2924/0781* (2013.01); *H01L 2924/01078* (2013.01); *H01L 2224/32225* (2013.01); *H01L 2224/32057* (2013.01); *H01L 2224/29101* (2013.01); *H01L 2924/01047* (2013.01); *H01L 2924/01019* (2013.01); *H01L 24/29* (2013.01); *C09J 9/02* (2013.01); *H01L 2924/01079* (2013.01); *H01L 2224/29198* (2013.01); *H01L 2924/01005* (2013.01); *H01L 2924/10157* (2013.01); *H01L 2224/73204* (2013.01); *H01L 2224/83385* (2013.01); *H01L 2924/01027* (2013.01); *H01L 2924/01004* (2013.01); *H01L 2224/48091* (2013.01); *H01L 33/60* (2013.01); *C08K 9/06* (2013.01); *H01L 2924/014* (2013.01); *H01L 2224/2919* (2013.01); *H01L 2224/83855* (2013.01); *H01L 33/405* (2013.01); *H01L 2924/01013* (2013.01); *H01L 2224/73265* (2013.01); *H01L 2924/01022* (2013.01); *H01L 2924/01056* (2013.01); *H01L 24/17* (2013.01); *H01L 24/83* (2013.01); *H01L 2924/0103* (2013.01); *H01L 24/06* (2013.01); *C08K 3/22* (2013.01)
USPC ............. 257/98; 257/99; 257/100; 257/753

(56) References Cited

FOREIGN PATENT DOCUMENTS

| | | | |
|---|---|---|---|
| JP | 2001-234152 | A | 8/2001 |
| JP | 2004-258105 | A | 9/2004 |
| JP | 2005-330327 | A | 12/2005 |
| JP | 2007-131677 | A | 5/2007 |
| JP | 2008-192880 | A | 8/2008 |
| WO | 2008/023605 | A1 | 2/2008 |

OTHER PUBLICATIONS

Extended European Search Report dated Jul. 4, 2014 in corresponding European Application No. 11768894.5 (6 pages).
Database WPI, Week 200751, Thomson Scientific, London, GB; AN 2007-519575 XP002726141 & JP 2007-131677, May 31, 2007 Abstract (2 pages).

* cited by examiner

LIGHT-REFLECTIVE ANISOTROPIC CONDUCTIVE ADHESIVE AGENT, AND LIGHT EMITTING DEVICE

FIELD OF THE INVENTION

This invention relates to a light-reflective anisotropic conductive adhesive to be used for anisotropic conductive connection of a light-emitting element onto a wiring board, and a light-emitting device having a light-emitting element mounted on a wiring board by using this light-reflective anisotropic conductive adhesive.

The present application claims priority rights to JP Patent Application 2010-092672 filed in Japan on Apr. 13, 2010, which is hereby incorporated by reference.

BACKGROUND OF THE INVENTION

Conventionally, a light-emitting device using a light-emitting element such as a light-emitting diode (LED) has been widely used. FIG. 3 to FIG. 5 each depict an example of structure of a light-emitting device of an old type. In manufacture of the light-emitting device depicted in FIG. 3, an LED element 33 is bonded onto a substrate 31 with a die bond adhesive 32, and a p electrode 34 and an n electrode 35 on an upper surface of the LED element 33 are wire-bonded to the substrate 31 with gold (Au) wires 37 by silver plating 36. With this, the LED element 33 and the substrate 31 are electrically bonded together. Normally, the whole LED element 33 is sealed with a resin such as a transparent mold resin (not shown). In some cases, exfoliation may occur at a connecting portion of any of the gold wires 37 due to a difference in coefficient of linear expansion between the resin, and the LED element 33 and the gold wires 37, and an electric connection defect may occur due to a break of any of the gold wires 37.

In general, for this light-emitting device, it is desired to inhibit a decrease in reflectance of light emitted from the LED element and maintain luminous efficiency (light extraction efficiency). In the light-emitting device depicted in FIG. 3, metal electrodes are normally used as the p electrode 34 and the n electrode 35 of the LED element 33. However, among light beams emitted from the LED element 33, a light beam having a wavelength of 400 nm to 500 nm emitted to an upper surface side is absorbed into the gold electrodes and the gold wires, and a light beam emitted to a lower side is absorbed into the die bond adhesive 32. This light absorption decreases luminous efficiency (light extraction efficiency) of the LED element 33. Moreover, the adhesion process with the die bond adhesive 32 is based on oven curing, thereby disadvantageously taking time for manufacture.

In the light-emitting device depicted in FIG. 4, a conductive paste 37 typified by a silver paste is used. With this conductive paste 37, the p electrode 34 and the n electrode 35 on the lower surface of the LED element 33 and the silver-plated portion 36 on the substrate 31 are electrically bonded together. However, since the conductive paste 37 has a weak adhesion force, reinforcement by a sealing resin 38 is required. Furthermore, light may be diffused or absorbed inside the conductive paste 37, thereby decreasing luminous efficiency of the LED element 33.

Thus, for example, what is suggested is electrical bonding in which an anisotropic conductive adhesive (ACP) or an anisotropic conductive adhesive film (ACF) is cured to connect and fix the LED element and the substrate together. For example, Patent Document 1 describes a method of flip-chip mounting the LED element. Also, for example, in the light-emitting device depicted in FIG. 5, a commercially-available anisotropic conductive adhesive 39 is used to electrically bond the p electrode 34 and the n electrode 35 on the lower surface of the LED element 33 and the substrate 31 together by flip-chip mounting. In this flip-chip mount technology, a bump 40 is formed on each of the p electrode 34 and the n electrode 35.

In the technology of Patent Document 1, a light reflective layer such as a metallized layer is provided to the LED element so as to be insulated from the p electrode and the n electrode. With this, a decrease in reflectance of light emitted from the LED element is inhibited to maintain luminous efficiency. However, this technology of Patent Document 1 has disadvantages such that the number of manufacturing processes of the light-emitting device is increased and cost is inevitably increased. On the other hand, in the light-emitting device depicted in FIG. 5, while a light reflective layer is not provided, Au or Ni to be used as conductive particles dispersed in an ACP binder appears brown or dark brown, and an imidazole-based latent curing agent normally contained in the binder appears brown. For such reasons, the ACP binder appears brown as a whole, thereby absorbing light. As a result, luminous efficiency of the LED element 33 is decreased.

PRIOR-ART DOCUMENTS

Patent Document

PTL 1: Japanese Patent Application Laid-Open No. 11-168235

SUMMARY OF THE INVENTION

Meanwhile, an epoxy resin is used as a binder resin in the ACP. In the ACP using the epoxy resin, an increase in conduction resistance, exfoliation of an adhesion surface, a crack, and others occur due to an internal stress based on a difference in coefficient of thermal expansion with temperature changes with respect to a connection substrate. For this reason, reliability may be decreased regarding corresponding reflow of lead-free solder, resistance to thermal shock, resistance to a corrosion phenomenon of a vapor-deposited wiring when used and stored in an atmosphere at high temperature and high humidity, and others.

The present invention was suggested in view of these conventional circumstances, and has an object in which, in a light-emitting device where a light-emitting element such as an LED element is mounted on a wiring board by using an anisotropic conductive adhesive by a flip-chip method to maintain luminous efficiency of the light-emitting element without providing a light-reflective layer that may invite manufacturing cost to an LED element, the occurrence of a crack in the anisotropic conductive adhesive is prevented to obtain high conduction reliability.

The inventor of the present invention has found that the occurrence of a crack can be prevented by forming each light-reflective insulating particle to be added into the anisotropic conductive adhesive in an acicular shape.

That is, the present invention is directed to a light-reflective anisotropic conductive adhesive to be used for anisotropic conductive connection of a light-emitting element to a wiring board, the adhesive containing a thermosetting resin, conductive particles, and light-reflective acicular insulating particles.

Also, in the present invention, a light-emitting element is mounted on a wiring board by a flip-chip method via this light-reflective anisotropic conductive adhesive.

EFFECTS OF INVENTION

According to the light-reflective anisotropic conductive adhesive and light-emitting device of the present invention, by adding light-reflective acicular insulating particles into the anisotropic conductive adhesive, the occurrence of a crack in the light-reflective anisotropic conductive adhesive can be prevented to obtain high conduction reliability.

DETAILED DESCRIPTION OF THE INVENTION

Figure 1A:
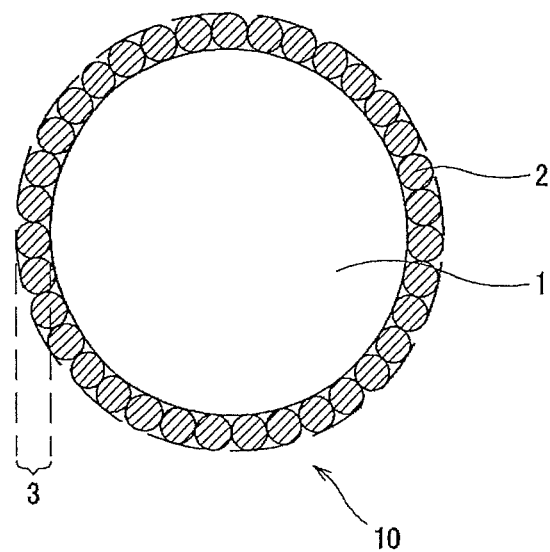
FIG. 1A is a sectional view of a light-reflective conductive particle.

An example of a specific embodiment (hereinafter referred to as a "present embodiment") of the light-reflective anisotropic conductive adhesive to which the present invention is applied is described below with reference to the drawings. The light-reflective anisotropic conductive adhesive in the present embodiment is an adhesive to be used for anisotropic conductive connection of an LED element, which is a light-emitting element, to a wiring board, and contains a thermosetting resin composite, conductive particles, and light-reflective acicular insulating particles.

The light-reflective acicular insulating particles are characterized as being formed of an acicular shape with an aspect ratio having a value within a predetermined range. When the thermosetting resin composite contains globular particles, if elasticity is decreased with temperature changes, a crack may occur from an interface between the globular particles and the thermosetting resin composite due to an internal stress of the thermosetting resin composite. As such, when a crack occurs in the light-reflective anisotropic conductive adhesive, conductance reliability may be impaired. For this reason, the light-reflective anisotropic conductive adhesive is required to have excellent toughness.

In the light-reflective anisotropic conductive adhesive in the present invention, acicular light-reflective insulating particles with an aspect ratio within a predetermined range are added to a thermosetting resin composite. In the thermosetting resin composite, acicular light-reflective insulating particles each arranged in a random direction cause an internal stress of the thermosetting resin composite in association with temperature changes to be propagated and absorbed into acicular crystals, thereby allowing this internal stress to be inhibited from being transmitted to the thermosetting resin. Thus, toughness of the thermosetting resin composite can be enhanced. With this, the light-reflective anisotropic conductive adhesive offers excellent toughness, and can inhibit the occurrence of a crack and exfoliation of an adhesion surface even if the thermosetting resin composite expands and contracts with temperature changes.

In a light-emitting device emitting visible light, the light-reflective acicular insulating particles are formed of an acicular inorganic compound that appears white, reflecting light incident to the light-reflective anisotropic conductive adhesive to the outside. With the light-reflective acicular insulating particles appearing white, wave length dependency of reflection characteristics with respect to visible light can be decreased, and visible light can be efficiently reflected.

As such, with the light-reflective anisotropic conductive adhesive in the present embodiment containing particles made of an acicular inorganic compound that appears white and has an aspect ratio within a predetermined ratio (these particles are hereinafter referred to as "white acicular inorganic particles"), a decrease in reflectance with respect to light emitted from the light-emitting element is inhibited to maintain luminous efficiency, and a crack and others are prevented to allow high conduction reliability to be obtained.

Examples of the white acicular inorganic particles can include zinc oxide whiskers, titanium oxide whiskers, titanate whiskers such as potassium titanate whiskers, aluminum borate whiskers, and needle-shaped inorganic compounds such as Wollastonite (needle crystal of kaolin silicate). Whiskers are crystals growing in needle shapes with a special process, and have advantages of high elasticity and resistance to deformation because of no irregularity in crystal structure. These inorganic compounds appear white in a light-emitting device emitting visible light, and therefore have small wavelength dependency of reflection characteristics with respect to visible light and tend to reflect visible light. Above all, zinc oxide whiskers are particularly preferable because they have a high degree of whiteness and no catalytic property with respect to photodegradation even when there is a concern of photodegradation of a cured material of a curable resin composite in a cured anisotropic conductive adhesive.

When formed of crystals each having one acicular shape (single acicular crystals), the white acicular inorganic particles preferably have a fiber diameter (a short-direction diameter) equal to or smaller than 5 μm. Also, the white acicular inorganic particles formed of single acicular crystals preferably have an aspect ratio larger than 10 and smaller than 35, and particularly preferably have an aspect ratio larger than 10 and smaller than 20. When the aspect ratio of the white acicular inorganic particles is larger than 10, the internal stress of the thermosetting resin can be sufficiently propagated and absorbed. Also, when the aspect ratio of the white acicular inorganic particles is smaller than 35, the acicular crystals are less prone to be broken and can be uniformly dispersed into the thermosetting resin, thereby not inhibiting anisotropic connection by the conductive particles. When this aspect ratio is smaller than 20, dispersibility into the thermosetting resin can be further improved.

By adding white acicular inorganic particles having an aspect ratio larger than 10 and smaller than 35 to the thermosetting resin composite, toughness of the thermosetting resin composite can be increased. Therefore, even if the light-reflective anisotropic conductive adhesive expands and contracts, exfoliation of the adhesion surface and the occurrence of a crack can be inhibited.

Note that as the white acicular inorganic particles, in place of these single acicular crystals, crystals each having a plurality of acicular shapes (plural acicular crystals) may be used, such as those each having a shape of, for example, a Tetrapod®, in which a center part and vertexes of a tetrahedron are connected to each other. The white acicular inorganic particles of plural acicular crystals are excellent in large thermal conductivity compared with white acicular inorganic particles of single acicular crystals, but have a bulky crystal structure more than that of the single acicular crystals, and therefore it is required to pay attention not to damage the substrate and bonding components by an acicular portion at the time of thermocompression.

Also, the acicular white inorganic particles may be processed with, for example, a silane coupling agent. With the acicular white inorganic particles processed with the silane coupling agent, dispersibility in the thermosetting resin composite can be improved. For this reason, the acicular white inorganic particles processed with the silane coupling agent can be uniformly mixed into the thermosetting resin composite for a short period of time.

The white acicular inorganic particles preferably have a refractive index (JIS K7142) preferably larger than the refractive index (JIS K7142) of the cured matter of the thermosetting resin composite, and more preferably larger by at least approximately 0.2. The reason for this is that if the difference in refractive index is small, reflection efficiency at an interface therebetween can be decreased. That is, even inorganic particles are light-reflective and insulating, those such as SiO2 having a refractive index equal to or smaller than the refractive index of the thermosetting resin composite for use cannot be applied as the white acicular inorganic particles.

When the content of the white acicular inorganic particles in the light-reflective anisotropic conductive adhesive is too small, sufficient light reflection cannot be achieved. On the other hand, when the content is too large, adhesiveness of the thermosetting resin is decreased. Therefore, the content is preferably 1 volume % (Vol %) to 50 volume % with respect to the thermosetting resin composite, and particularly preferably 5 volume % to 25 volume %.

The light-reflective anisotropic conductive adhesive in the present embodiment contains these white acicular inorganic particles to cover the most part of the conductive particles. Therefore, even if the conductive particles appear brown or the like, whiteness of the thermosetting resin composite can be achieved. With this whiteness of the thermosetting resin composite, wavelength dependency of reflection characteristics with respect to visible light is decreased, and visible light can become easily reflective. Thus, irrespectively of the type of color of the substrate electrodes, a decrease in reflectance of light emitted from the LED element can be inhibited, and light emitted from the LED element toward its lower surface side can also be efficiently utilized. As a result, luminous efficiency (light extraction efficiency) of the LED element can be improved.

And, in the light-reflective anisotropic conductive adhesive in the present embodiment, the shape of each of white inorganic particles as the light-reflective insulating particles is acicular. With this, the internal stress of the thermosetting resin composite with temperature changes can be propagated and absorbed into the acicular crystals to inhibit transmission of this internal stress to the thermosetting resin. Note that when the particle shape is globular, the internal stress of the thermosetting resin composite is less prone to be propagated and absorbed into the particles, compared with the case of the acicular particles.

As such, since the light-reflective anisotropic conductive adhesive inhibits transmission of this internal stress to the thermosetting resin, toughness of the thermosetting resin composite can be enhanced. With this, the light-reflective anisotropic conductive adhesive offers excellent toughness, and can inhibit the occurrence of a crack and exfoliation of the adhesion surface even if the thermosetting resin composite expands and contracts with temperature changes.

Note that the light-reflective anisotropic conductive adhesive in the present embodiment may be formed by adding white acicular inorganic particles to a thermosetting resin composite containing particles made of a globular inorganic compound that appears white as light-reflective insulating particles (these particles are hereinafter referred to as "white globular inorganic particles"). The white globular inorganic particles are preferably made of a material similar to that of the white acicular inorganic particles described above, and those such as SiO2 having a refractive index lower than the refractive index of the thermosetting resin composite for use cannot be applied.

With addition of the white globular inorganic particles together with these white acicular inorganic particles, the thermosetting resin composite can be further whitened to further improve light extraction efficiency of the LED element. Also in this case, toughness of the thermosetting resin can be enhanced. Here, the amount of addition (Vol %) of the white acicular inorganic particles is preferably equal to or larger than the amount of addition (Vol %) of the white globular inorganic particles.

White globular inorganic particles tend to have low reflectance when they are too small and tend to inhibit connection by anisotropic conductive particles when they are too large. Therefore, their size is preferably 0.02 µm to 20 µm, and more preferably 0.2 µm to 1 µm.

The white globular inorganic particles preferably have a refractive index (JIS K7142) larger than the refractive index (JIS K7142) of the cured matter of the thermosetting resin composite, and more preferably have a refractive index by at least 0.02.

As the globular light-reflective insulating particles, in place of these white globular inorganic particles, resin-coated metal particles having a surface of globular metal particles coated with a transparent insulating resin may be used. As the metal articles, those made of nickel, silver, aluminum, or the like can be cited.

As for the size of the resin-coated metal particles, a particle diameter of 0.1 µm to 30 µm is preferable, and 0.2 µm to 10 µm is more preferable. Note that the size of the resin-coated metal particles represents the size including the insulating coating.

As the resin in these resin-coated metal particles, various insulating resins can be used. In view of functional strength and transparency, a cured matter of an acryl-based resin can be preferably utilized. Preferably, a resin obtained by radical copolymerization of methyl methacrylate and methacrylate 2-hydroxyethyl under the presence of a free-radical initiator such as an organic peroxide such as benzoyl peroxide can be cited. In this case, the resin is more preferably cross-linked with an isocyanate-based cross-linking agent such as 2,4-tolylene diisocyanate.

Also, in metal particles, a γ-glycidoxy group, a vinyl group, or the like is preferably introduced in advance to a metal surface by using a silane coupling agent.

These resin-coated metal particles can be manufactured by, for example, introducing metal particles and a silane coupling agent into a solvent such as toluene, agitating them for approximately one hour at a room temperature, and then introducing a radical monomer, a radical polymerization initiator, and, as required, a cross-linking agent and agitating them while heating to a radical polymerization start temperature.

In the light-reflective anisotropic conductive adhesive, even when white globular inorganic particles are added together with the white acicular inorganic particles, the light-reflective anisotropic conductive adhesive can offer excellent toughness, thereby inhibiting exfoliation of the adhesion surface and the occurrence of a crack even with expansion and contraction with temperature changes.

As the conductive particles contained in the light-reflective anisotropic conductive adhesive in the present embodiment, particles of a metal material used in conventional conductive particles for anisotropic conductive connection can be used. That is, examples of the metal material of the conductive particles can include gold, nickel, copper, silver, soldering, palladium, aluminum, an alloy thereof, and a multilayered matter thereof (for example, nickel plating/metal flash plating matter).

Note that since the conductive particles with gold, nickel, or copper being taken as a metal material appear brown, the effects of the present invention can be enjoyed more than other metal materials. That is, as described above, since white acicular inorganic particles covers the most part of the conductive particles in the thermosetting resin composite, brownish appearance of the thermosetting resin composite due to the conductive particles is inhibited, and the whole thermosetting resin composite comes to have a high degree of whiteness.

Also, as the conductive particles, metal-coated resin particles obtained by coating resin particles with a metal material may be used. Examples of these resin particles can include styrene-based resin particles, benzoguanamine resin particles, and nylon resin particles. As a method of coating the resin particles with the metal material, a conventionally known method can be adopted. For example, an electroless plating method, an electroplating method, or others can be used. Also, the layer thickness of the coating metal material is any as long as good connection reliability can be ensured, normally 0.1 μm to 3 μm, although it depends on the particle diameter of the resin particles and the type of the metal.

Also, a conduction defect tends to occur when the particle diameter of the resin particles is too small, and an inter-pattern short circuit tends to occur when the particle diameter is too large. Therefore, the particle diameter is preferably 1 μm to 20 μm, more preferably 3 μm to 10 μm, and further particularly preferably 3 μm to 5 μm. In this case, each of the resin particles is preferably in a globular shape, but may be in a flaky shape or a rugby-ball shape.

The metal-coated resin particles each have a globular shape, and its particle diameter is preferably 1 μm to 20 μm, and more preferably 3 μm to 10 μm, because connection reliability is decreased if the diameter particle is too large.

Figure 1B:
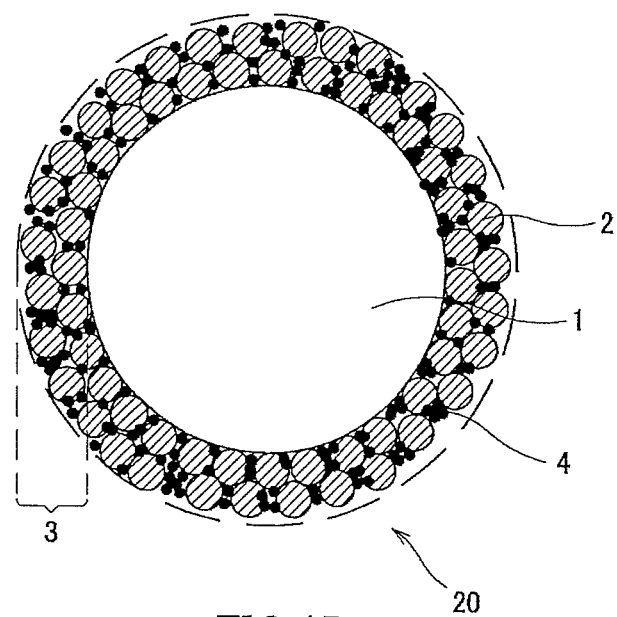
FIG. 1B is a sectional view of the light-reflective conductive particle.

Note that the conductive particles contained in the light-reflective anisotropic conductive adhesive in the present embodiment can be light-reflective conductive particles provided with light reflective properties as depicted in, for example, FIG. 1A and FIG. 1B.

A light-reflective conductive particle 10 depicted in FIG. 1A is configured of a core particle 1 coated with a metal material and a light reflective layer 3 on a surface thereof and formed from inorganic particles 2 of at least one type selected from titanium oxide (TiO2) particles, zinc oxide (ZnO) particles, and aluminum oxide (Al2O3) particles. The light reflective layer 3 formed from these inorganic particles appears a color in a range from white to gray. For this reason, as described above, wavelength dependency of reflection characteristics with respect to visible light is small, visible light can be easily reflected, and luminous efficiency of the LED element can be more improved.

Note that when there is a concern of photodegradation of the cured matter of the thermosetting resin composite of the cured anisotropic conductive adhesive, as described above, from among the titanium oxide particles, the zinc oxide particles, and the aluminum oxide particles, the zinc oxide having no catalytic property with respect to photodegradation and also having a high refractive index can be preferably used.

The core particle 1 is for anisotropic conductive connection, and has a surface configured of a different metal material. Examples of the form of the core particle 1 can include a form in which the core particle 1 itself is made of a metal material, or a form in which the surface of the resin particles is covered with a metal material.

In view of a relative size with respect to the particle diameter of the core particle 1, when the layer thickness of the light reflective layer 3 formed from the inorganic particles 2 is too small with respect to the particle diameter of the core particle 1, a decrease in reflectance becomes significant. When the layer thickness is too large, a conduction defect occurs. For this reason, the layer thickness of the light reflective layer 3 is preferably 5% to 50%, and more preferably 1% to 25%.

Also, in light-reflective conductive particles 10, when the particle diameter of the inorganic particles 2 configuring the light reflective layer 3 is too small, a light reflecting phenomenon tends to be hard to occur. When the particle diameter is too large, formation of the light reflective layer tends to be difficult. For this reason, the particle diameter of the inorganic particles 2 is preferably 0.02 μM to 4 μm, and particularly preferably 0.1 μm to 1 μm or 0.2 μm to 0.5 μm. In this case, in view of the wavelength of light for light reflection, the particle diameter of the inorganic particles 2 is preferably equal to or larger than 50% of the wavelength of light so that the light to be reflected (that is, light emitted from the light-emitting element) is prevented from passing. In this case, the inorganic particle 2 can have a formless shape, a globular shape, a scale shape, an acicular shape, and other shapes. Above all, the globular shape is preferable in view of a light diffusion effect, and the scale shape is preferable in view of a total reflection effect.

The light-reflective conductive particles 10 can be manufactured by a known film forming technology (a so-called mechanofusion method) of forming a film of small particles on a surface of large-particle-diameter particles by causing physical collision among large and small powders. In this case, the inorganic particles 2 are fixed so as to be engaged into the metal material on the surface of the core particle 1. On the other hand, the inorganic particles are less prone to be fused and fixed to each other. Thus, a mono-layer of the inorganic particles configures the light reflective layer 3. Therefore, in the case of FIG. 1A, the layer thickness of the light reflective layer 3 is considered to be equivalent to or slightly thinner than the particle diameter of the inorganic particles 2.

Light-reflective conductive particles 20 depicted in FIG. 1B contain a thermoplastic resin 4 for which the light reflective layer 3 functions as an adhesive. With this thermoplastic resin 4, the inorganic particles 2 are fixed to each other, and the inorganic particles 2 are multilayered (for example, forming two layers or three layers), which is different from the light-reflective conductive particles 10 of FIG. 1A. With this thermoplastic resin 4 being contained, mechanical strength of the light reflective layer 3 is improved, and exfoliation of the inorganic particles is less prone to occur.

As the thermoplastic resin 4, a halogen-free thermoplastic resin can be preferably used with the intension of a low environmental load. For example, polyolefin such as polyethylene or polypropylene, polystyrene, or acrylic resin can be preferably used.

These light-reflective conductive particles 20 can be manufactured also by a mecha-fusion method. When the particle diameter of the thermoplastic resin 4 to be applied to the mecha-fusion method is too small, an adhesion function is decreased. When the particle diameter is too large, the resin is less prone to be attached to the core particle. Therefore, the particle diameter is preferably 0.02 μm to 4 μm, and more preferably 0.1 μm to 1 μm. Also, when the content of this thermoplastic resin 4 is too small, the adhesion function is decreased. When the content is too large, an aggregate of the particles is formed. Therefore, the content is preferably 0.2 mass parts to 500 mass parts with respect to 100 mass parts of the inorganic particles 2, and more preferably 4 mass parts to 25 mass parts.

As the thermosetting resin contained in the light-reflective anisotropic conductive adhesive in the present embodiment, a colorless and transparent resin is preferably used. This is not to decrease light reflection efficiency of the light-reflective conductive particles in the anisotropic conductive adhesive and furthermore to allow incident light to be reflected with its light color unchanged. Here, "colorless and transparent" means that the cured matter of the anisotropic conductive adhesive has an optical path length of 1 cm and a light transmission (JIS K7105) of 80% or higher, preferably 90% or higher, with respect to visible light having a wavelength of 380 nm to 780 nm.

In the light-reflective anisotropic conductive adhesive, a content of conductive particles such as light-reflective conductive particles with respect to 100 mass parts of the thermosetting resin composite is preferably 1 mass part to 100 mass parts and more preferably 10 mass parts to 50 mass parts, because a conduction defect tends to occur when the content is too small and an inter-pattern short circuit tends to occur when the content is too large.

With addition of white acicular inorganic particles to the thermosetting resin composite, the light-reflective anisotropic conductive adhesive in the present embodiment has a value of reflectance (JIS K7105) higher than 9%, with respect to light having a wavelength of 450 nm. The reflection characteristics of the light-reflective anisotropic conductive adhesive in the present embodiment achieves a reflectance (JIS K7105) of 30% or higher with respect to light having a wavelength of 450 nm, by appropriately adjusting various other factors, for example, the reflection characteristics and content of the light-reflective conductive particles and the content composition of the thermosetting resin composite. Normally, the reflectance tends to increase when the content of the light-reflective conductive particles having excellent reflection characteristics is increased.

Also, the reflection characteristics of the light-reflective anisotropic conductive adhesive can be evaluated from a point of view of a refractive index. That is, this is because when the reflection of the cured matter is larger than the refractive index of the cured matter of the thermosetting resin composite from which the conductive particles and the light-reflective insulating particles are excluded, the light reflection amount is increased at an interface between the light-reflective insulating particles and a cured matter of their surrounding thermosetting resin composite. Specifically, a difference obtained by subtracting the refractive index (JIS K7142) of the cured matter of the thermosetting resin composite from the refractive index (JIS K7142) of the light-reflective insulating particles is desired to be preferably 0.02 or higher, and more preferably 0.2 or higher. Note that the thermosetting resin composite having an epoxy resin as a main component has a refractive index of approximately 1.5.

As the thermosetting resin composite, one used in a conventional anisotropic conductive adhesive and anisotropic conductive film can be used. In general, this thermosetting resin composite is obtained by adding a curing agent to an insulating binder resin. As the insulating binder resin, an epoxy-based resin having an alicyclic epoxy compound, a heterocyclic epoxy compound, a hydrogen-added epoxy compound, or the like as a main component is preferably cited.

As the alicyclic epoxy compound, one having two or more epoxy groups in a molecule is preferably cited. This may be in the form of liquid or solid. Specific examples can include glycidyl hexahydro bisphenol A, 3,4-epoxy cyclohexenyl methyl-3', and 4-epoxy cyclohexene carboxylate. Above all, glycidyl hexahydro bisphenol A, 3,4-epoxy cyclohexenyl methyl-3', or 4-epoxy cyclohexene carboxylate can be preferably used because optical transparency suitable for mounting of an LED element can be ensured for the cured material and any of these compound is excellent in quick curability.

As the heterocyclic epoxy compound, an epoxy compound having a triazine ring can be cited. Particularly preferably, 1,3,5-tris(2,3-epoxypropyl)-1,3,5-triazine-2,4,6-(1H, 3H, 5H)-trione can be cited.

As the water-added epoxy compound, the above-described alicyclic epoxy compound or heterocyclic epoxy compound to which hydrogen is added, or any of other known hydrogen-added epoxy compounds can be used.

The alicyclic epoxy compound, the heterocyclic epoxy compound, and the hydrogenated epoxy compound may be used singly, or two or more types thereof can be used together. Also, in addition to any of these epoxy compounds, another epoxy compound may be used together unless the effects of the present invention are impaired. Examples include: glycidyl ether obtained by causing polyhydric phenol and epichlorohydrin to react with each other, the polyhydric phenol such as bisphenol A, bisphenol F, bisphenol S, tetramethyl bisphenol A, diarylbisphenol A, hydroquinone, catechol, resorcin, cresol, tetrabromobisphenol A, trihydroxy biphenyl, benzophenone, bisresorcinol, bisphenol hexa fluoroacetone, tetramethyl bisphenol A, tetramethyl bisphenol F, tris(hydroxyphenyl)methane, bixylenol, phenol novolac, or cresol novolac; poly glycidyl ether obtained by causing aliphatic polyalcohol and epichlorohydrin to react with each other, the aliphatic polyalcohol such as glycerol, neopentyl glycol, ethylene glycol, propylene glycol, hexylene glycol, polyethylene glycol, or polypropylene glycol; glycidyl ether ester obtained by causing hydroxy carboxylate, such as p-hydroxy benzoic acid or β-hydroxy naphthoic acid, and epichlorohydrin to react with each other; polyglycidyl ester obtained from polycarboxylic acid such as phthalic acid, methyl phthalic acid, isophthalic acid, terephthalic acid, tetrahydrophthalic acid, endomethylene tetrahydrophthalic acid, endomethylene hexahydrophthalic acid, trimellitic acid, or polymerized fatty acid; glycidyl aminoglycidyl ether obtained from aminophenol or aminoalkylphenol; glycidyl aminoglycidyl ester obtained from amino benzoic acid; glycidyl amine obtained from aniline, toluidine, tribromoaniline, xylylenediamine, diaminocyclohexane, bisaminomethylcyclohexane, 4,4'-diaminodiphenylmethane, or 4,4'-diaminodiphenylsulfone; or known epoxy resins such as epoxidized polyolefin.

As the curing agent can include an acid anhydride, an imidazole compound, and cyanogen, or others can be cited. Above all, an acid anhydride that is less prone to discolor the cured material, in particular, an alicyclic acid anhydride, can be preferably used. Specifically, a methylhexahydrophthalic acid anhydride or the like can be preferably cited.

When an alicyclic epoxy compound and an alicyclic acid anhydride-based curing agent are used in the thermosetting resin composite, their amounts of use have a tendency that the amount of an uncured epoxy compound becomes more as the amount of the alicyclic acid anhydride-based curing agent is too small and corrosion of the adherend material is promoted under the influence of a superfluous curing agent when the amount of the curing agent is too large. Therefore, for 100 mass parts of the alicyclic epoxy compound, the alicyclic acid anhydride-based curing agent is used at a ratio of preferably 80 mass parts to 120 mass parts and more preferably 95 mass parts to 105 mass parts.

The light-reflective anisotropic conductive adhesive in the present embodiment can be manufactured by uniformly mixing the thermosetting resin composite, the conductive particles, and the white acicular inorganic particles, which are light-reflective insulating particles, together. Also, in the case of making a light-reflective anisotropic conductive film, the thermosetting resin composite, the conductive particles, and the white acicular inorganic particles, which are light-reflective insulating particles, are mixed together in a dispersed manner with a solvent such as toluene, a PET film subjected to an exfoliation process is coated with the resultant mixture so as to have a desired thickness, and is then dried at a temperature on the order of approximately 80 degrees Celsius.

Figure 2:
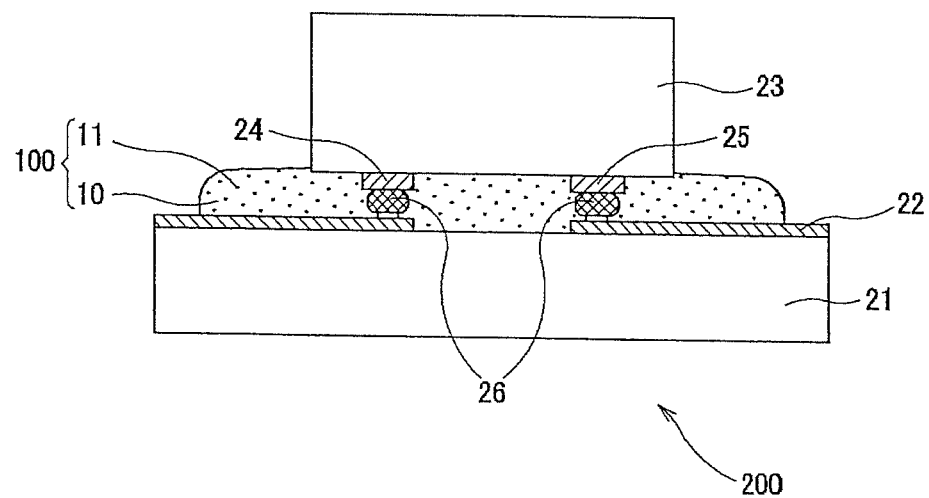
FIG. 2 is a sectional view of a light-emitting device in a present embodiment.
Figure 3:
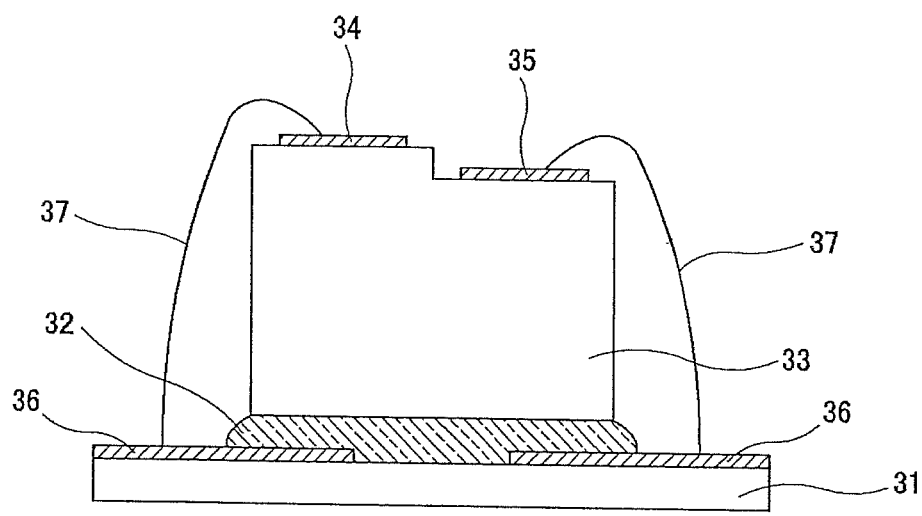
FIG. 3 is a sectional view of a conventional light-emitting device.
Figure 4:
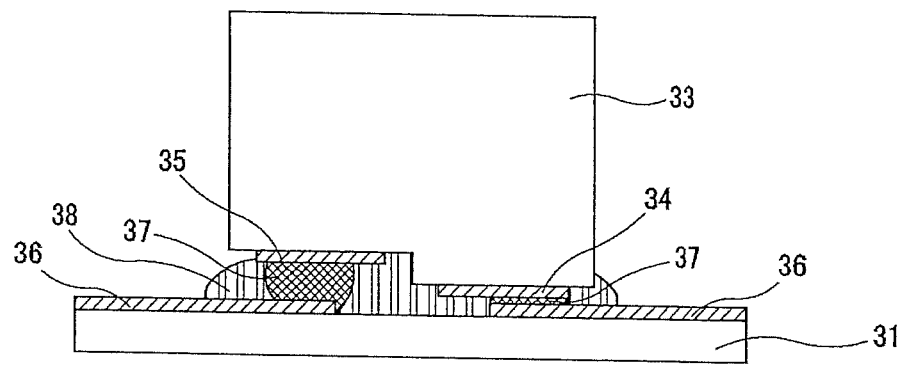
FIG. 4 is a sectional view of the conventional light-emitting device.
Figure 5:
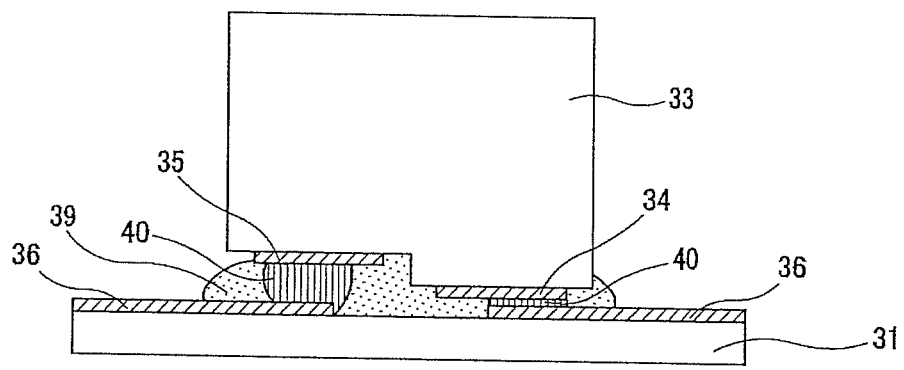
FIG. 5 is a sectional view of the conventional light-emitting device.

Next, a light-emitting device formed by mounting a light-emitting element on a wiring board using the light-reflective anisotropic conductive adhesive in the present embodiment is described with reference to FIG. 2. A light-emitting device 200 depicted in FIG. 2 is a light-emitting device in which a space between a connection terminal 22 on a substrate 21 and connection bumps 26 formed on an n electrode 24 and a p electrode 25 of an LED element 23 as a light-emitting element is coated with the light-reflective anisotropic conductive adhesive described above, thereby achieving flip-flop mount of the substrate 21 and the LED element 23. Here, a cured matter 100 of the light-reflective anisotropic conductive adhesive is formed with light-reflective insulating particles 10 being dispersed into a cured matter 11 of a thermosetting resin composite. Note that, as required, a transparent mold resin may be used for sealing so as to cover the whole LED element 23.

In the above-structured light-emitting device 200, among light beams emitted from the LED element 23, a light beam emitted toward a substrate 21 side is reflected from the light-reflective insulating particles 10 in the cured matter 100 of the light-reflective anisotropic conductive adhesive and is emitted from an upper surface of the LED element 23. Therefore, a decrease in luminous efficiency can be prevented.

The structures other than the light-reflective anisotropic conductive adhesive in the light-emitting device 200 (such as the LED element 23, the bumps 26, the substrate 21, and the connection terminal 22) can be similar to structures in a conventional light-emitting device. Also, the light-emitting device 200 can be manufactured by using a conventional anisotropic conductive connection technology except that the light-reflective anisotropic conductive adhesive in the present embodiment is used. Note that as the light-emitting element, in addition to the LED element 23, a known light-emitting element can be applied in a range of not impairing the effects of the present invention.

EXAMPLES

Specific examples of the present invention are described below. Note that the scope of the present invention is not restricted to any of the examples described below.

Example 1

(Fabrication of Anisotropic Conductive Adhesive)
White acicular inorganic particles and conductive particles each having a surface of a globular resin plated with gold (a particle diameter of 5 µm) were mixed into a thermosetting resin composite made of an epoxy curing-based adhesive (an adhesive binder having CE2021P-MeHHPA as a main component), thereby fabricating an anisotropic conductive adhesive. The amount of addition of the white acicular inorganic particles was 12.0 volume % with respect to the thermosetting resin composite. As the white acicular inorganic particles, titanium dioxide (TiO2) whiskers having a long-direction particle diameter of 1.7 µm and a short-direction particle diameter of 0.13 µm (an aspect ratio of 13.1) were used. Also, the amount of addition of the conductive particles was 10 mass % with respect to the thermosetting resin composite.

(Evaluation of Optical Reflectance)
A white board was coated with the fabricated anisotropic conductive adhesive so that the coating has a thickness of 100 µM, and was cured by being heated at 200 degrees Celsius for one minute. As for the obtained cured matter, a total reflectance (specular reflection and diffuse reflection) with respect to light having a wavelength of 450 nm with barium sulfate taken as being a standard was measured by using a spectrophotometer (UV3100 manufactured by Shimadzu Corporation).

(Fabrication of LED-Mount Sample)
On a glass epoxy substrate having wirings where copper wirings at a 100 µm-pitch were plated with Ni/Au (5.0 µm thickness/0.3 µm thickness), gold (Au) bumps having a height of 15 µm were formed by using a bump holder (FB700 manufactured by KAIJO Corporation). On this epoxy substrate with gold bumps, blue LED (Vf=3.2 V (If=20 mA)) elements were flip-chip-mounted by using a light-reflective anisotropic conductive adhesive under conditions of 200 degrees Celsius, twenty seconds, and 1 kg/chip, thereby obtaining a test-purpose LED module.

(Evaluation of Total Luminous Flux Amount)
As for the obtained test-purpose LED module, a total luminous flux measurement system (integrating sphere type) (LE-2100 manufactured by Otsuka Electronics Co., Ltd.) was used to measure a total luminous flux amount (measurement condition If=20 mA (constant current control)).

(Evaluation as to Conduction Reliability and Presence or Absence of Occurrence of Crack)
Conduction reliability and the presence or absence of occurrence of a crack were evaluated with a thermal cycle test (TCT). The test-purpose LED module was put into a TCT, and (a) 1000 cycles each for thirty minutes at −40 degrees Celsius←→thirty minutes at 100 degrees Celsius and (b) 1000 cycles each for thirty minutes at −55 degrees Celsius←→thirty minutes at 125 degrees Celsius were performed. That is, (a) the module was exposed to atmospheres at −40 degrees Celsius and 100 degrees Celsius each for thirty minutes, and 1000 thermal cycles each with the above process being taken as one cycle were performed. Also (b) the module was exposed to atmospheres at −55 degrees Celsius and 125 degreed Celsius, and 1000 thermal cycle each with the above process being taken as one cycle were performed For evaluation of conduction reliability, regarding the test-purpose LED module extracted from the TCT after 1000 cycles of the TCT were performed, a Vf value at the time of If=20 mA was measured. When an increase in the Vf value from an initial Vf value is within 5%, conduction reliability was determined as excellent, and marked as "○". when an increase in the Vf value from the initial Vf value is equal to or larger than 5%, conduction reliability was determined as not excellent and marked as "x".

For evaluation of the presence or absence of the occurrence of a crack, after 1000 cycles of the TCT were performed, the test-purpose LED module extracted from the TCT was observed from an upper surface of a blue LED element by a metallographical microscope, thereby observing the presence or absence of the occurrence of a crack. The case in which the occurrence of a crack was not observed in the light-reflective anisotropic conductive adhesive is marked as "○", and the case in which the occurrence of a crack was observed in the light-reflective anisotropic conductive adhesive is marked as "x".

Example 2

As the white acicular inorganic particles, zinc oxide (ZnO) whiskers (pana-tetra WZ-05F1 manufactured by AMTEC CO., LTD.) having a long-direction particle diameter of 50 µm and a short-direction particle diameter of 3 µm (an aspect ratio of 16.7) were used. Other than that, a process similar to that of Example 1 was performed.

Example 3

As the white acicular inorganic particles, potassium titanate whiskers (TISMO series manufactured by Otsuka Chemical Co., Ltd.) having a long-direction particle diameter of 20 µm and a short-direction particle diameter of 0.6 µm (an aspect ratio of 33.3) were used. Other than that, a process similar to that of Example 1 was performed.

Example 4

As the white acicular inorganic particles, those with the surface of zinc oxide (ZnO) whiskers (pana-tetra WZ-05F1 manufactured by AMTEC CO., LTD.) having a long-direction particle diameter of 50 µm and a short-direction particle diameter of 3 µm (an aspect ratio of 16.7) processed with a silane coupling agent were used. Other than that, a process similar to that of Example 1 was performed.

Example 5

As the white acicular inorganic particles, zinc oxide (ZnO) whiskers (pana-tetra WZ-05F1 manufactured by AMTEC CO., LTD.) having a long-direction particle diameter of 50 µm, a short-direction particle diameter of 3 µm, and an aspect ratio of 16.7 were added to the thermosetting resin composite at a ratio of 9.0 volume %. Also, white globular inorganic particles (I type manufactured by SAKAI CHEMICAL INDUSTRY CO., LTD.) of zinc oxide (ZnO) having a particle diameter of 0.6 µm (an aspect ratio of 1.0) were added to the thermosetting resin composite at a ratio of 3.0 volume %. Other than that, a process similar to that of Example 1 was performed.

Comparative Example 1

No white acicular inorganic particles were contained in the anisotropic conductive adhesive. Other than that, a process similar to that of Example 1 was performed.

Comparative Example 2

In place of the white acicular inorganic particles of Example 1, white globular inorganic particles of titanium oxide of 0.9 µm (an aspect ratio of 1.0) were added to the thermosetting resin composite at a ratio of 12.0 volume %. Other than that, a process similar to that of Example 1 was performed.

Comparative Example 3

In place of the white acicular inorganic particles of Example 1, white globular inorganic particles of zinc oxide of 0.6 µm (an aspect ratio of 1.0) were added to the thermosetting resin composite at a ratio of 12.0 volume %. Other than that, a process similar to that of Example 1 was performed.

Table 1 shows the results of Examples 1 to 5 and Comparative Examples 1 to 3.

TABLE 1

| | | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 | COMPARATIVE EXAMPLE 3 |
|---|---|---|---|---|---|---|---|---|---|
| WHITE ACICULAR INORGANIC PARTICLE | TYPE | $TiO_2$ | ZnO | POTASSIUM TITANATE | ZnO (SURFACE SILANE PROCESS) | ZnO/ZnO | — | $TiO_2$ | ZnO |
| | PARTICLE DIAMETER (LONG) (µm) | 1.7 | 50 | 20 | 50 | 50/0.6 | — | 0.9 | 0.6 |
| | PARTICLE DIAMETER (SHORT) (µm) | 0.13 | 3 | 0.6 | 3 | 3/0.6 | — | 0.9 | 0.6 |
| | ASPECT RATIO | 13.1 | 16.7 | 33.3 | 16.7 | 16.7/1.0 | — | 1.0 | 1.0 |
| | ADDITION AMOUNT (Vol %) | 12.0 | 12.0 | 12.0 | 12.0 | 9/3 | — | 12.0 | 12.0 |
| CONDUCTIVE PARTICLE | PLATING TYPE | Au | Au | Au | Au | Au | Au | Au | Au |
| | PARTICLE DIAMETER (µm) | 5 | 5 | 5 | 5 | 5 | 5 | 5 | 5 |
| OUTER APPEARANCE OF ADHESIVE | COLOR | WHITE | WHITE | WHITE | WHITE | WHITE | BROWN | WHITE | WHITE |

TABLE 1-continued

| | | | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 | COMPARATIVE EXAMPLE 3 |
|---|---|---|---|---|---|---|---|---|---|---|
| REFLECTANCE | 450 nm | (%) | 55 | 35 | 30 | 35 | 40 | 8 | 62 | 40 |
| OPTICAL CHARACTERISTIC | TOTAL LUMINOUS FLUX AMOUNT (mlm) | INITIAL STAGE | 350 | 300 | 250 | 300 | 350 | 200 | 330 | 350 |
| OUTER APPEARANCE | CRACK | TCT (−40 to 100° C.) −1000 cyc | ○ | ○ | ○ | ○ | ○ | ○ | ○ | ○ |
| | | TCT (−55 to 125° C.) −1000 cyc | ○ | ○ | ○ | ○ | ○ | ○ | x | x |
| ELECTRIC CHARACTERISTIC | CONDUCTION | INITIAL STAGE | ○ | ○ | ○ | ○ | ○ | ○ | ○ | ○ |
| | RELIABILITY | TCT (−40 to 100° C.) −1000 cyc | ○ | ○ | ○ | ○ | ○ | ○ | ○ | ○ |
| | | TCT (−55 to 125° C.) −1000 cyc | ○ | ○ | ○ | ○ | ○ | ○ | ○ | ○ |

As can be seen from the results of Example 1 shown in Table 1, the reflectance of the cured matter of the light-reflective anisotropic conductive adhesive obtained by adding 12.0 volume % of TiO2 (titanium dioxide) having an aspect ratio of 13.1 as white acicular inorganic particles to the thermosetting resin composite was 55% with respect to the wavelength of 450 nm. Also, the total luminous flux amount of the LED mount sample using this light-reflective anisotropic conductive adhesive was 350 (mlm). The reflectance and efficiency of extracting light from the LED were both slightly decreased compared with Comparative Example 2 using globular TiO2 (white globular inorganic particles). However, a crack did not occur after 1000 cycles of a TCT (−40 degrees Celsius to 100 degrees Celsius) and after 1000 cycles of a TCT (−55 degrees Celsius to 125 degrees Celsius), and crack resistance was improved.

As can be seen from the results of Example 2, the reflectance of the cured matter of the light-reflective anisotropic conductive adhesive obtained by adding 12.0 volume % of ZnO (zinc oxide) having an aspect ratio of 16.7 as acicular white inorganic particles to the thermosetting resin composite was 35% with respect to the wavelength of 450 nm. Also, the total luminous flux amount of the LED mount sample using this light-reflective anisotropic conductive adhesive was 300 (mlm). The reflectance and efficiency of extracting light from the LED were both slightly decreased compared with Comparative Example 3 using globular ZnO (white globular inorganic particles). However, a crack did not occur after 1000 cycles of the TCT (−40 degrees Celsius to 100 degrees Celsius) and after 1000 cycles of the TCT (−55 degrees Celsius to 125 degrees Celsius), and crack resistance was improved.

As can be seen from the results of Example 3, the reflectance of the cured matter of the light-reflective anisotropic conductive adhesive obtained by adding 12.0 volume % of potassium titanate having an aspect ratio of 33.3 as white acicular inorganic particles to the thermosetting resin composite was 30% with respect to the wavelength of 450 nm. Also, the total luminous flux amount of the LED mount sample using this light-reflective anisotropic conductive adhesive was 250 (mlm). The reflectance and efficiency of extracting light from the blue LED were both slightly decreased compared with Comparative Example 3 using granular ZnO (white globular inorganic particles). However, a crack did not occur after 1000 cycles of the TCT (−40 degrees Celsius to 100 degrees Celsius) and after 1000 cycles of the TCT (−55 degrees Celsius to 125 degrees Celsius), and crack resistance was improved.

As can be seen from the results of Example 4, the reflectance of the cured matter of the light-reflective anisotropic conductive adhesive obtained by adding 12.0 volume % of ZnO having an aspect ratio of 16.7 as white acicular inorganic particles to the thermosetting resin composite was 35% with respect to the wavelength of 450 nm. Also, the total luminous flux amount of the LED mount sample using this light-reflective anisotropic conductive adhesive was 300 (mlm). The reflectance and efficiency of extracting light from the LED were both slightly decreased compared with Comparative Example 3 using granular ZnO (white globular inorganic particles). However, a crack did not occur after 1000 cycles of the TCT (−40 degrees Celsius to 100 degrees Celsius) and after 1000 cycles of the TCT (−55 degrees Celsius to 125 degrees Celsius), and crack resistance was improved.

As can be seen from the results of Example 5, the reflectance of the cured matter of the light-reflective anisotropic conductive adhesive obtained by adding 9.0 volume % of zinc oxide (ZnO) having an aspect ratio of 16.7 as white acicular inorganic particles to the thermosetting resin composite and adding 3.0 volume % of globular ZnO (white globular inorganic particles) to the thermosetting resin composite was 40% with respect to the wavelength of 450 nm. Also, the total luminous flux amount of the LED mount sample using this light-reflective anisotropic conductive adhesive was 250 (mlm). The reflectance and efficiency of extracting light from the LED were both slightly decreased compared with Comparative Example 3 using granular zinc oxide (ZnO) as white globular inorganic particles. However, a crack did not occur after 1000 cycles of the TCT (−40 degrees Celsius to 100 degrees Celsius) and after 1000 cycles of the TCT (−55 degrees Celsius to 125 degrees Celsius), and crack resistance was improved.

As can be seen from the results of Comparative Example 1, the reflectance of the cured matter of the anisotropic conductive adhesive obtained by not adding acicular white inorganic particles but adding 10 mass % of conductive particles to the thermosetting resin composite was 8% with respect to the wavelength of 450 nm. The total luminous flux amount of the LED mount sample using this anisotropic conductive adhesive was 200 (mlm). Since light having a wavelength of 450 nm emitted from the blue LED were absorbed into gold (Au), the reflectance with respect to this light was decreased, thereby decreasing luminous efficiency (light extraction efficiency) of the blue LED was decreased. A crack did not occur after 1000 cycles of the TCT (−40 degrees Celsius to 100 degrees Celsius) and after 1000 cycles of the TCT (−55 degrees Celsius to 125 degrees Celsius).

As can be seen from the results of Comparative Example 2, the reflectance of the light-reflective anisotropic conductive adhesive obtained by adding 12.0 volume % of white globular inorganic particles of titanium dioxide (TiO2) to the thermosetting resin composite was 62% with respect to the wavelength of 450 nm. The total luminous flux amount of the LED mount sample using this light-reflective anisotropic conductive adhesive was 390 (mlm). However, while a crack did not occur after 1000 cycles of the TCT (−40 degrees Celsius to 100 degrees Celsius), a crack occurred after 1000 cycles of the TCT (−55 degrees Celsius to 125 degrees Celsius).

As can be seen from the results of Comparative Example 3, the reflectance of the light-reflective anisotropic conductive adhesive obtained by adding 12.0 volume % of white globular inorganic particles of zinc oxide (ZnO) to the thermosetting resin composite was 40% with respect to the wavelength of 450 nm. The total luminous flux amount of the LED mount sample using this light-reflective anisotropic conductive adhesive was 350 (mlm). While a crack did not occur after 1000 cycles of the TCT (−40 degrees Celsius to 100 degrees Celsius), a crack occurred after 1000 cycles of the TCT (−55 degrees Celsius to 125 degrees Celsius).

Note that it has been found that, after 1000 cycles of the TCT (−40 degrees Celsius to 100 degrees Celsius) and after 1000 cycles of the TCT (−55 degrees Celsius to 125 degrees Celsius), the anisotropic conductive adhesives of Examples 1 to 5 and Comparative Examples 1 to 3 initially have high resistance to these temperature changes and offer excellent conduction reliability.

As can be seen from the results described above, in Examples 1 to 5 using the light-reflective anisotropic conductive adhesive with white acicular inorganic particles added to the thermosetting resin composite, a decrease in reflectance with respect to light emitted from the LED element can be inhibited, and luminous efficiency (light extraction efficiency) of the LED element can be improved. Also, in the light-reflective anisotropic conductive adhesives in Examples 1 to 5, high crack resistance was confirmed even after the TCT. The reason for this can be thought such that toughness of the thermosetting resin composite can be increased by the white acicular inorganic particles formed of acicular shapes. Also, it was found that the light-reflective anisotropic conductive adhesives in Examples 1 to 5 have high resistance to temperature changes and offer excellent conduction reliability.

REFERENCE SIGNS LIST

21 . . . substrate, 22 . . . connection terminal, 23 . . . LED element, 24 . . . n electrode, 25 . . . p electrode, 26 . . . bump, 200 . . . light emitting device

The invention claimed is:

1. A light-reflective anisotropic conductive adhesive to be used for anisotropic conductive connection of a light-emitting element to a wiring board, the adhesive comprising:
   a thermosetting resin;
   conductive particles comprising inorganic particles that are multilayered and fixed; and
   light-reflective acicular insulating particles.

2. The light-reflective anisotropic conductive adhesive according to claim 1, wherein the light-reflective acicular insulating particles are inorganic particles of at least one type selected from the group comprising titanium oxide, zinc oxide, and titanate.

3. The light-reflective anisotropic conductive adhesive according to claim 1, wherein the light-reflective acicular insulating particles are formed by processing a surface of zinc oxide with a silane agent.

4. The light-reflective anisotropic conductive adhesive according to claim 1, wherein the light-reflective acicular insulating particles have an aspect ratio larger than 10 and smaller than 35.

5. The light-reflective anisotropic conductive adhesive according to claim 1, wherein the light-reflective acicular insulating particles have an aspect ratio larger than 10 and smaller than 20.

6. The light-reflective anisotropic conductive adhesive according to claim 1, wherein a content of the light-reflective acicular insulating particles in the thermosetting resin composite is 1 volume % to 50 volume % with respect to the thermosetting resin composite.

7. The light-reflective anisotropic conductive adhesive according to claim 1, wherein the adhesive further includes light-reflective globular insulating particles.

8. The light-reflective anisotropic conductive adhesive according to claim 7, wherein the light-reflective acicular insulating particles are contained with a volume amount equal to or larger than a volume amount of the light-reflective globular insulating particles.

9. A light-emitting device in which a light-emitting element is mounted on a wiring board by a flip-chip method via the light-reflective anisotropic conductive adhesive according to claim 1.

10. The light-emitting device according to claim 9, wherein the light-emitting element is a light-emitting diode.

11. The light-reflective anisotropic conductive adhesive according to claim 2, wherein the light-reflective acicular insulating particles have an aspect ratio larger than 10 and smaller than 35.

12. The light-reflective anisotropic conductive adhesive according to claim 3, wherein the light-reflective acicular insulating particles have an aspect ratio larger than 10 and smaller than 35.

13. The light-reflective anisotropic conductive adhesive according to claim 2, wherein the light-reflective acicular insulating particles have an aspect ratio larger than 10 and smaller than 20.

14. The light-reflective anisotropic conductive adhesive according to claim 3, wherein the light-reflective acicular insulating particles have an aspect ratio larger than 10 and smaller than 20.

15. The light-reflective anisotropic conductive adhesive according to claim 2, wherein a content of the light-reflective acicular insulating particles in the thermosetting resin composite is 1 volume % to 50 volume % with respect to the thermosetting resin composite.

16. The light-reflective anisotropic conductive adhesive according to claim 3, wherein a content of the light-reflective acicular insulating particles in the thermosetting resin composite is 1 volume % to 50 volume % with respect to the thermosetting resin composite.

17. The light-reflective anisotropic conductive adhesive according to claim 4, wherein a content of the light-reflective acicular insulating particles in the thermosetting resin composite is 1 volume % to 50 volume % with respect to the thermosetting resin composite.

18. The light-reflective anisotropic conductive adhesive according to claim 5, wherein a content of the light-reflective acicular insulating particles in the thermosetting resin composite is 1 volume % to 50 volume % with respect to the thermosetting resin composite.

* * * * *